United States Patent [19]

Lanzo

[11] Patent Number: 5,060,365

[45] Date of Patent: Oct. 29, 1991

[54] TOOL FOR INSTALLATION OF CONNECTOR PIN BUSHINGS INTO A COMPUTER PATCH BOARD

[75] Inventor: Robert F. Lanzo, La Mesa, Calif.

[73] Assignee: General Dynamics Corporation, Convair Division, San Diego, Calif.

[21] Appl. No.: 597,916

[22] Filed: Oct. 10, 1990

[51] Int. Cl.[5] .......... H05K 13/04

[52] U.S. Cl. .......... 29/739; 29/268; 29/758

[58] Field of Search .......... 29/739, 741, 758, 267, 29/268

[56] References Cited

U.S. PATENT DOCUMENTS 4,365,411 12/1982 Muldoon, Jr. .......... 29/739 X 4,884,336 12/1989 Waters et al. .......... 29/739 X

*Primary Examiner*—Carl E. Hall

*Attorney, Agent, or Firm*—John R. Duncan; Frank D. Gilliam

[57] ABSTRACT

A tool for installation of pin connector assemblies into a computer path board, the pin assembly being of a type that permits a locking bushing to be slid over the pin into a recess within the body of the assembly and thereby cause a tight interference fit of the assembly within a receiving orifice in the patch board. The tool includes a retainer to engage a guide groove formed on the upper portion of the pin assembly and a tubular driver that is mechanically coupled to the retainer for driving the locking bushing into position. The retainer and the tubular driver are preferably connected to opposing handles of a biased plier arrangement. The plier arrangement may be hand or machine operated.

11 Claims, 1 Drawing Sheet

TOOL FOR INSTALLATION OF CONNECTOR PIN BUSHINGS INTO A COMPUTER PATCH BOARD

BACKGROUND OF THE INVENTION

This invention relates to an improvement in the field of installation of pin connector assemblies into computer patch boards and more particularly, but not by way of limitation, to a tool for easily inserting in a consistent repeatable manner a locking bushing into a pin connector assembly positioned in a computer patch board for locking installation therein.

In the field of data processing it is required to insert pin connector assemblies into a computer patch board. The pin connector assembly includes a body portion that is manually inserted into a receiving orifice in the patch board. The receiving orifice is preferably sized to receive the body portion of the pin connector assembly in an interference fit commensurate with retention of the assembly within the orifice without further assistance and ease of insertion of the pin connector assembly into the computer patch board. After such insertion of the pin connector assembly into the orifice in the computer patch board the pin connector assembly is then locked into such position.

The preferred method for locking such assembly into position involves slipping a locking bushing over the pin extending upwardly from the pin connector assembly and then pushing the locking bushing downwardly over the pin into an annular relieved portion within the body portion of the pin connector assembly to urge the assembly into a more secure interference fit within the receiving orifice of the computer patch board. The usual method employed within the computer industry to install such pin connector assemblies into a computer patch board involves providing an annular relieved portion on the upper portion of the pin connector assembly for receiving a retainer tool after the bushing has been manually inserted into a complementary shaped orifice in a computer patch board. The assembler then slips a bushing over the pin extending upwardly from the connector assembly and pushes the bushing downwardly to a locking position by mean of a hand held tube which he holds in his other hand.

While this practice of installing pin connector assemblies into a computer patch board has been successfully practiced. as with any repetitive hand assembly operation that must be practiced quickly over long periods of time, is not entirely satisfactory from either the perspective of the assembler or as to consistent repetitive minimum time results. The industry practice of pin connector assemblies is fatiguing to the assembler, causes blisters to the hands of the assembler, gives rise to carpal tunnel syndrome, and other medical problems.

Obviously, such method involves constant attention to its application to achieve acceptable results. The assembler must be cautious to carefully insert the retainer into the receiving groove provided in the pin connector assembly and keep it held in its proper position while the bushing is locked into position since failure to do so may result in the tool used to drive the bushing into locking position pushing the pin connector assembly completely out of the computer patch board. Pin assemblies accidentally pushed out of the board are very hard and time consuming to replace. The driving or pressing tube must be carefully aligned and manipulated by the assembler to assure correct alignment of the tube on the pin and to assure correct positioning of the locking bushing within the pin connector assembly without over pressing of the bushing into the assembly.

A need has existed, that has not been satisfied until the present invention, for an insert tool for installation of connector pin bushings into a computer patch board that permits rapid installation of pin connector assemblies in a manner that if quick, repeatable, consistent and accurate with a minimum of attention and physical strain of the assembler.

BRIEF DESCRIPTION OF THE INVENTION

Briefly stated, the present invention contemplates a tool for inserting a locking bushing into a pin connector assembly positioned within a complementarily shaped orifice in a computer patch board, the pin connector assembly having a pin that extends vertically above the upper surface of the computer patch board, an annular relieved portion provided in a body portion of the pin assembly extending over the computer patch board, and an annular recess formed in the upper body portion of the pin assembly surrounding the pin for receiving the locking bushing and adapted to be positioned mediate the upper and lower surfaces of the patch board when the pin assembly is positioned therein. The tool preferably comprises a retainer means adapted to be received within the relieved portion provided in the body portion of a pin assembly and a tubular drive means adapted to receive therewithin the vertically extending pin of the pin assembly after a locking bushing has been placed upon the pin. Means are drivingly connected to the drive means for driving the tubular drive means a predetermined distance downwardly on the pin and to engage the locking bushing to slide it downwardly on the pin into the annular recess to lock the pin assembly with the computer patch board in an interference fit. The tool may be advantageously accommodated in two journalled biased handles for hand or machine actuation. The length of travel of the drive means may be predetermined to accurately control the positioning of the locking bushing and the drive means is aligned with the retainer by a suitable guide means to assure that the bushing is correctly driven into locking position without pushing the assembly from the patch board.

Other advantages and features of the present invention will become clear from the following detailed description of the preferred embodiment of the invention when read in conjunction with the drawings and appended claims.

DETAILED DESCRIPTION OF THE DRAWINGS

Figure 1:
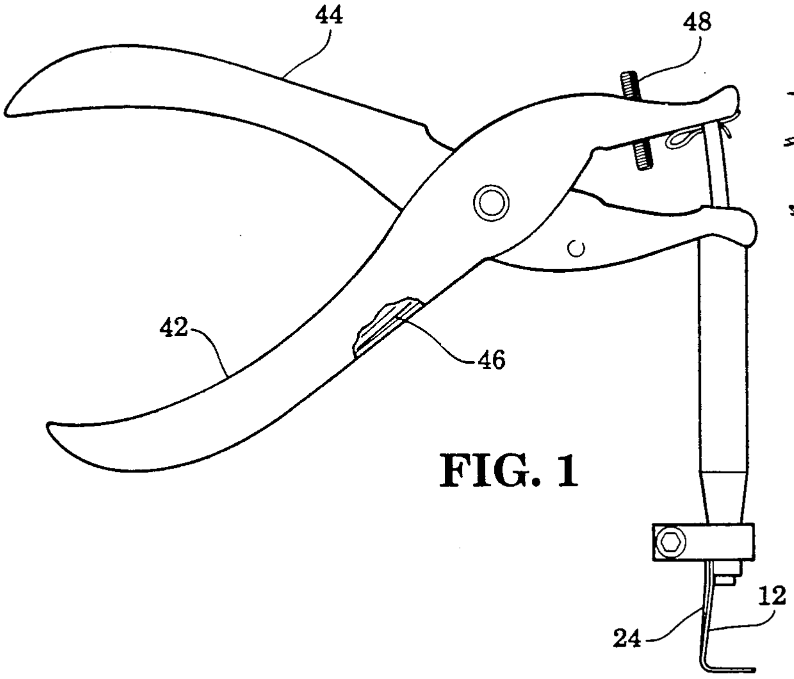
FIG. 1 is a perspective illustrating a tool embodying the present invention and having a portion cut away for ease of illustration.
Figure 2:
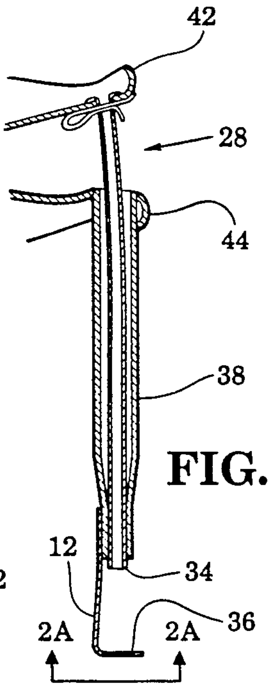
FIG. 2 is a simplified section of a portion of a tool embodying the invention and illustrating the cooperation of the key elements of the invention.
Figure 2A:
FIG. 2A is an end view of the retainer member of the tool.
Figure 3:
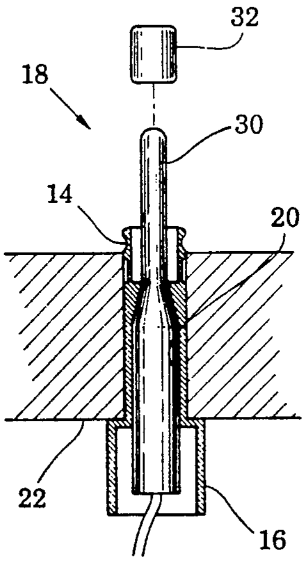
FIG. 3 is a perspective of a pin connector assembly that has been inserted into a receiving orifice in a computer patch board and is in position to receive the locking bushing shown.

Referring to the drawing in general and to FIGS. 1 and 2 in particular, the reference character 10 generally designates an insert tool constructed in accordance with a preferred embodiment of the invention. The tool 10 includes a retainer means 12 adapted to be received with a relieved portion 14 provided in the body portion 16 of a pin connector assembly 18 that has been pushed into a complementarily shaped orifice 20 provided in a computer patch board 22, as seen in FIG. 3. The retainer means 12 in the present invention takes the form of an angle shaped member 24 which is provided at its lower portion with a generally shaped "V" shaped opening 26 into which is positioned a relieved or grooved portion 14 in the pin connector assembly.

Figure 4:
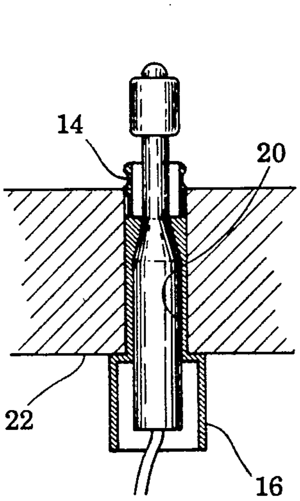
FIG. 4 is a perspective of the pin connector assembly after the locking bushing has been slipped over the pin and is in position for being driven into locking position by actuation of the tool of the instant invention.

A tubular drive means 28 is adapted to receive therewithin the vertically extending pin 30 of the pin connector assembly 18 after a locking bushing 32 has been slipped over the pin 30 as seen in FIGS. 3 and 4. The tubular drive means 28 takes the form of a bushing pusher tube 34 that is positioned normal to the retainer plate portion 36 of the retainer member 24. The bushing pusher tube 34 is slidingly constrained within a guide tube 38 which is preferably of lesser diameter at its lower end to better receive the tube 34 and accurately align the tube 34 with the pin connector assembly 18 when the bushing is to locked into position.

Means are drivingly connected to the drive means 28 for driving the tubular drive means 28 a predetermined distance downwardly on the pin 30 and to engage the locking bushing 32 to slide it downwardly on the pin 30 into the annular recess 40 formed with the pin connector assembly 18 to lock the assembly within the computer patch board 22. This means takes the form of a member 42 that is secured to the drive tube 28 in any suitable manner. Preferably, the member 42 is a first handle member that is suitably journalled to a second handle member 44 that is connected to the guide tubular member 38 in any suitable manner. The handle members 42 and 44 are preferably biased to an open position by a suitable spring 46 that may be positioned within the handles 42 and 44 in the usual manner.

The travel of the pusher tube 34 within the retainer tube 38 is predetermined by a suitable limit screw 48 that is threadedly positioned in one of the handles to control the travel of one handle toward another. While the tool 10 is advantageously used by an assembler to insert pin connector assemblies in a computer patch board, it is apparent that the tool 10 is susceptible to incorporation in a further assembly arrangement that would permit machine operation of the tool 10.

Figure 5:
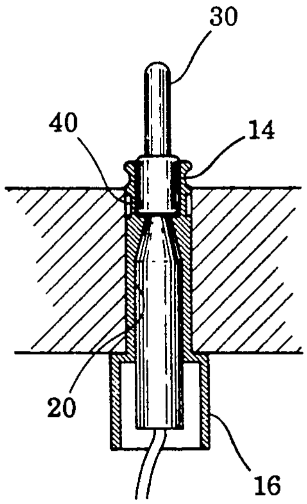
FIG. 5 is a perspective of the pin connector assembly after the bushing has been locked into position to secure the assembly in the computer patch board in an interference fit.

In operation, a pin connector assembly 18 is positioned in an orifice 20 in the computer patch board 22 so that the grooved portion 14 of the assembly 18 extends above the patch board 22. The bushing 32 as seen in FIG. 3 is slipped over the pin 30 to the position shown in FIG. 4. The retainer 24 of the tool 10 is then positioned so that the groove 14 is received within the open portion 26 of the retainer 24. Actuation of the tool 10 then causes handle 42 to move toward handle 44 to cause the connected bushing pusher tube 34 which has been positioned over the pin 30 to cause the bushing 32 to be driven downwardly on the pin 30 to recess 40 and thereby cause the assembly to be locked within the computer patch board 22 in a tight interference fit as more clearly shown in FIG. 5.

It will be appreciated that the present invention provides an insert tool which permits the insertion of assemblies into a computer patch board at a greatly accelerated rate. The mechanical advantage built into the tool reduces the force required to install such assemblies. The retainer is incorporated into the tool and provides for automatic alignment of the bushing pushing portion of the tool that also provides automatic axial loading of the bushing during insertion. The adjustable stroke limit screw controls the depth of the insertion of the bushing into the assembly and thereby provides repeatable consistent insertions even though there may be variations in the technique of an assembler utilizing the tool.

While a presently preferred embodiment of the present invention has been described for purposes of this particular disclosure, numerous changes may be made which will rapidly suggest themselves to those skilled in the art and which are encompassed within the spirit of the invention disclosed and defined in the appended claims.

What is claimed is:

1. A tool for inserting a locking bushing into a pin connector assembly positioned within a complementary shaped orifice in a computer patch panel board, the pin connector assembly having a pin that extends vertically above the upper surface of the computer patch board, an annular relieved portion provided in a body portion of the pin assembly surrounding the pin for receiving the locking bushing and positioned mediate the upper and lower surfaces of the patch board when the pin assembly is positioned therein, which tool comprises:

a retainer means for engaging the relieved portion provided in the body portion of said pin assembly;

tubular drive means for receiving within the vertically extending pin of the pin assembly after a locking bushing has been placed upon the pin; and means drivingly connected to the drive means for driving the tubular drive means a predetermined distance downwardly on the pin into the annular recess to lock the pin assembly within the computer patch board in an interference fit while said retainer means engages said relieved portion.

2. The tool according to claim 1 which further includes means to slidingly surround the tubular drive means to ensure the axial movement of the tubular drive means over the pin is correctly spatially oriented with respect to the retainer means positioned within the relieved portion in the body portion o: the pin assembly.

3. The tool according to claim 2 wherein the means slidingly surrounding the tubular drive means comprises a tubular member having the retainer means fixedly connected to one end.

4. The tool according to claim 3 wherein the retainer means comprises a retainer plate member having an inwardly extending relieved portion to adapt the plate member to be removably positioned within the relieved portion of the pin assembly.

5. The tool according to claim 1 and further including adjustable means to predetermine the length of the axial travel of the tubular drive means.

6. The tool according to claim 4 wherein the plate member is perpendicularly connected to the tubular member surrounding the tubular drive means so that the axial travel of the tubular member is normal to the plane of the retainer plate member.

7. The tool according claim 5 and further including a first handle member coupled to the retainer means and a second handle member connected to the tubular drive means, such handle members cooperating for actuation of the tool by an operator.

8. The tool according to claim 7 wherein such handle members are journalled together for pivoting action.

9. The tool according to claim 8 wherein the handle members are normally biased into an open, non-actuation position.

10. The tool according to claim 7 wherein the adjustable means comprises an adjustable screw positioned within one handle member and for extending toward the other handle member for contact therewith to thereby limit the travel of the tubular drive means.

11. The tool according to claim 8 wherein the first and second handle members are graspable and operatable by a human operator.

* * * * *